(12) United States Patent
Choi et al.

(10) Patent No.: US 9,159,755 B2
(45) Date of Patent: Oct. 13, 2015

(54) IMAGE SENSOR AND METHOD FOR FABRICATING THE SAME

(71) Applicant: SK hynix Inc., Gyeonggi-do (KR)

(72) Inventors: Chung-Seok Choi, Gyeonggi-do (KR); Jong-Chae Kim, Gyeonggi-do (KR); Do-Hwan Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 15 days.

(21) Appl. No.: 14/106,820

(22) Filed: Dec. 15, 2013

(65) Prior Publication Data

US 2015/0123226 A1    May 7, 2015

(30) Foreign Application Priority Data

Sep. 3, 2013 (KR) .......................... 10-2013-0105619

(51) Int. Cl.
| | | |
|---|---|---|
| *H01L 21/31* | (2006.01) | |
| *H01L 21/469* | (2006.01) | |
| *H01L 27/146* | (2006.01) | |

(52) U.S. Cl.
CPC .... *H01L 27/14621* (2013.01); *H01L 27/14627* (2013.01); *H01L 27/14685* (2013.01)

(58) Field of Classification Search
CPC ............... H01L 21/02107; H01L 21/02126; H01L 21/8238; H01L 27/0814; H01L 27/14621; H01L 27/14643; H01L 29/6603; H01L 29/861

USPC ......... 438/141, 779, 700, 311, 70, 75, 63, 69; 257/292, 294, 347, 79, 87, 414, 439, 257/462, 463, 396, E21.006, E21.053, 257/E21.077, E21.351, E21.352
See application file for complete search history.

(56) References Cited

U.S. PATENT DOCUMENTS

| | | | |
|---|---|---|---|
| 7,888,763 B2 * | 2/2011 | Qian et al. ..................... 257/460 |
| 7,985,658 B2 * | 7/2011 | Lei et al. ........................ 438/455 |
| 8,436,443 B2 * | 5/2013 | Hsu et al. ....................... 257/447 |
| 8,531,575 B2 * | 9/2013 | Saitou et al. .................. 348/294 |
| 8,591,826 B2 * | 11/2013 | Auer et al. .................... 422/300 |
| 8,614,495 B2 * | 12/2013 | Chuang et al. ................ 257/460 |
| 2010/0060758 A1 | 3/2010 | Oshiyama et al. |
| 2011/0316002 A1 | 12/2011 | Ahn et al. |

OTHER PUBLICATIONS

Si, Y., et al., Synthesis of water soluble graphene, Nano Letters, 2008, pp. 1679-1682, vol. 8, No. 6.
Lee, S., et al., Tailored assembly of graphene from solvent dispersion, Polymer Science and Technology, Apr. 2011, pp. 130-132, vol. 22, No. 2.

* cited by examiner

*Primary Examiner* — David Nhu
(74) *Attorney, Agent, or Firm* — IP & T Group LLP

(57) ABSTRACT

An image sensor includes a photoelectric conversion region formed in a substrate, an interlayer insulation layer formed over a front side of the substrate, a carbon-containing layer doped with impurities and formed over a back side of the substrate, and a color filter and a micro-lens formed over the carbon-containing layer.

14 Claims, 3 Drawing Sheets

IMAGE SENSOR AND METHOD FOR FABRICATING THE SAME

CROSS-REFERENCE TO RELATED APPLICATIONS

The present application claims priority of Korean Patent Application No. 10-2013-0105619, filed on Sep. 3, 2013, which is incorporated herein by reference in its entirety.

BACKGROUND

1. Field

Exemplary embodiments of the present invention relate to a method of fabricating a semiconductor device, and more particularly, to a back side illumination image sensor and a method for fabricating the same.

2. Description of the Related Art

An image sensor is a device that converts an optical image into an electric signal. The image sensor is generally classified into a charge coupled device type (CCD type) image sensor and a complementary metal oxide semiconductor type (CMOS type) image sensor. The image sensor includes a plurality of pixels, and each pixel outputs a pixel signal corresponding to incident light. Each pixel accumulates photocharges corresponding to the incident light through a photoelectric conversion device, i.e., a photo diode, and outputs the pixel signal based on the accumulated photocharges.

In the image sensor, dark current is generated due to the electric charges generated at the surface of the substrate where the photoelectric conversion device is formed. The dark current degrades the properties of the image sensor by acting as noise to the pixel signal.

SUMMARY

An exemplary embodiment of the present invention is directed to an image sensor that may prevent deterioration in properties of the device due to dark current.

In accordance with an exemplary embodiment of the present invention, an image sensor includes a photoelectric conversion region formed in a substrate, an interlayer insulation layer formed over a front side of the substrate, a carbon-containing layer doped with impurities and formed over a back side of the substrate, and a color filter and a micro-lens formed over the carbon-containing layer.

The image sensor may further include an anti reflective layer formed between the back side of the substrate and the carbon-containing layer.

In accordance with another exemplary embodiment of the present invention, a method for fabricating an image sensor includes forming a photoelectric conversion region in a substrate, forming an interlayer insulation layer over a front side of the substrate, forming a carbon-containing layer having electric charges over a back side of the substrate, forming a color filter over the carbon-containing layer, and forming a micro-lens over the color filter.

The method may further include forming an anti reflective layer over the back side of the substrate before the forming of the carbon-containing layer.

DETAILED DESCRIPTION

Figure 1:
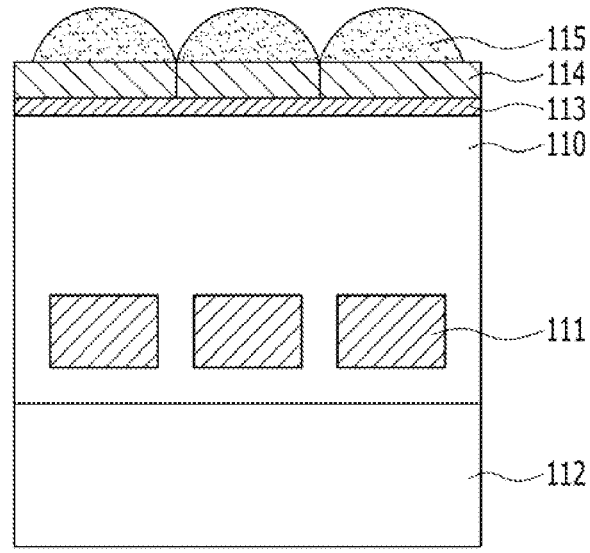
FIG. 1 is a cross-sectional view illustrating an image sensor in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a cross-sectional view illustrating an image sensor in accordance with an embodiment of the present invention.

Referring to FIG. 1, in a substrate 110 having a plurality of pixel's, a photoelectric conversion region 111 corresponding to the pixels, and a device isolation structure (not illustrated) isolating the pixel's are formed. An interlayer insulation layer 112 including a signal generating circuit (not illustrated) is formed over a front side of the substrate 110. A carbon-containing layer 113 having the electric charges is formed at a back side of the substrate 110. A color filter 114 is formed over the back side of the substrate 110 and a micro-lens 115 is formed over the color filter 114.

The substrate 110 includes a semiconductor substrate. The semiconductor substrate may be a single crystal state, and it may include a material containing silicon. That is, the substrate 110 may include a material having single crystal silicon. For example, the substrate 110 may be a bulk silicon substrate, or a silicon on insulator (SOI) substrate including a silicon epitaxial layer.

The photoelectric conversion region 111 may include a plurality of photoelectric conversion units (not illustrated), which are overlapped with each other. Each photoelectric conversion unit may include a photo diode having an N-type impurity region and a P-type impurity region. The photoelectric conversion region 111 may be formed at both the front side and the back side of the substrate 110 and have a structure passing through the substrate 110. Also, the photoelectric conversion region 111 may be formed at the front side of the substrate 110 and may be formed lower than the back side of the substrate 110 by a certain level.

The interlayer insulation layer 112 may include one or more materials selected from the group including an oxide, a nitride and an oxynitride. A signal generating circuit formed in the interlayer insulation layer 112 may include a plurality of transistors (not illustrated), multilayer metal lines (not illustrated), and contact plugs (not illustrated) electrically coupling the transistors and the metal lines. The signal generating circuit generates and outputs the pixel signals (or electrical signals) corresponding to the photocharges generated in the photoelectric conversion region 111.

A buffer layer (not illustrated) may be formed between the back side of the substrate 110 and the carbon-containing layer 113. The buffer layer may increase reliability of the device by controlling defects occurring during the fabrication of the carbon-containing layer 113.

The carbon-containing layer 113 may prevent generation of the dark current and the noise by controlling electric charges that generates the dark current and the noise. The carbon-containing layer 113 may be formed in contact with the back side of the substrate 110, and the carbon-containing layer 113 may formed in an area overlapped with the photoelectric conversion region 111.

The carbon-containing layer 113 may include a graphene layer or a graphene-oxide layer. Light transmittances of the graphene layer and the graphene-oxide layer are known to about 98% or more. Thus, the carbon-containing layer 113 including the graphene layer or the graphene-oxide layer may improve sensitivity of the image sensor by minimizing light loss. The carbon-containing layer 113 may be formed with a thickness of 0.35 nm to 1 nm.

The carbon-containing layer 113 may include the graphene layer doped with impurities or the graphene-oxide layer doped with impurities in order to get a positive electric charge or a negative electric charge. The carbon-containing layer having the positive electric charge may prevent the generation of the dark current by pulling electron and controlling the flow of the electron. The carbon-containing layer having the negative electric charge may prevent the generation of the dark current by forming a hole accumulation region and limiting behavior of the electron through the hole accumulation region.

In the color filter 114, a plurality of filters are formed corresponding to the photoelectric conversion region 111. For example, a red filter, a green filter, and a blue filter may be formed corresponding to the photoelectric conversion region 111 of a red (R) pixel, a green (G) pixel and a blue (B) pixel. Also, when the image sensor includes an infrared photoelectric conversion region, an infrared filter corresponding to an infrared photo detector may be formed.

The micro-lens 115 may include a plurality of micro-lenses to focus the incident light to the photoelectric conversion region 111 in a corresponding pixel. The incident light through the micro-lens 115 is filtered and selected by corresponding color filters (the red filter, the green filter and the blue filter) or the infrared filter, and the selected light enters to the photoelectric conversion region 111 in the corresponding pixel.

As described above, the generation of the dark current may be prevented by forming the carbon-containing layer 113 having the electric charges. Since the carbon-containing layer 113 is formed using the grapheme layer, the light loss may be minimized due to high light transmittance of the graphene layer. In case of the back side illumination image sensor, since semiconductor fabrication processes are performed to the back side of the substrate 110 as well as the front side of the substrate 110, damage and defects due to dangling bond of the material occur. Thus, the effect on preventing the dark current may be maximized by using the carbon-containing layer 113 having the electric charges.

Figure 2A:
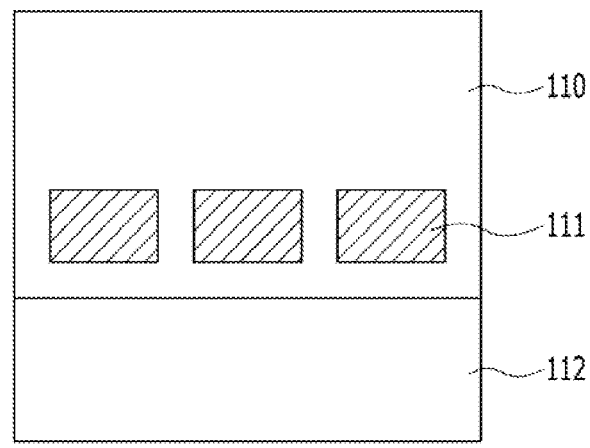
FIGS. 2A to 2C are cross-sectional views illustrating a method for fabricating the image sensor in accordance with the embodiment of the present invention.
Figure 2B:
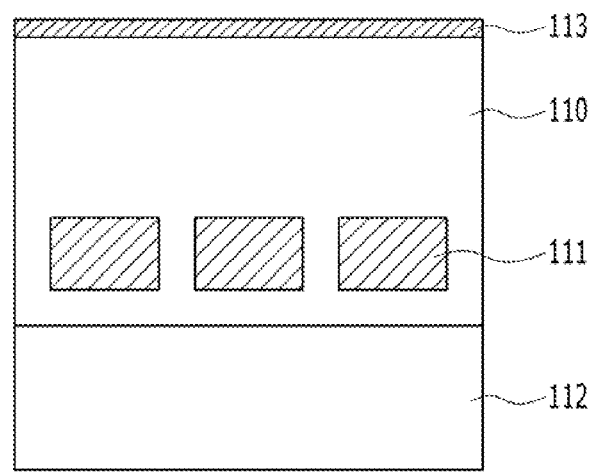
Figure 2C:
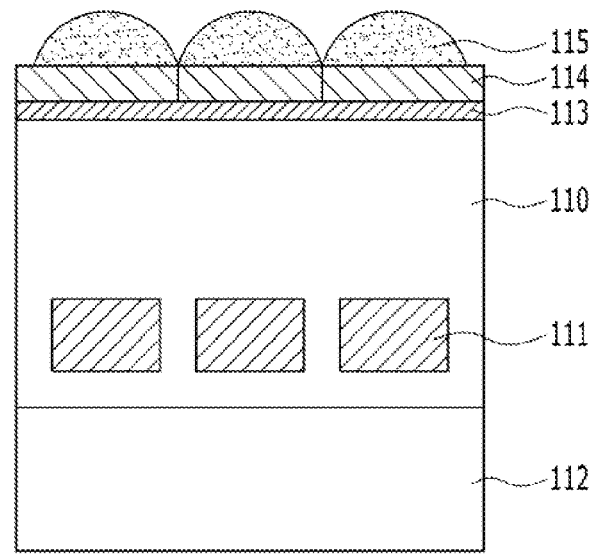

FIGS. 2A to 2C are cross-sectional views illustrating a method for fabricating the image sensor in accordance with the first embodiment of the present invention. FIGS. 2A to 2C illustrates a method for fabricating the image sensor shown in FIG. 1, and it is described with the same reference numeral as FIG. 1 for better understanding.

Referring to FIGS. 2, a substrate 110 is prepared where a plurality of pixels are defined. The substrate 110 includes a semiconductor substrate. The semiconductor substrate may be a single crystal state, and it may include a material containing silicon. That is, the substrate 110 may include a material having single crystal silicon. For example, the substrate 110 may be a bulk silicon substrate, or a silicon on insulator (SOI) substrate including a silicon epitaxial layer.

Subsequently, a device isolation structure (not illustrated) is formed in the substrate 110 along a boundary region between the plurality of pixels. The device isolation structure is formed by a shallow trench isolation (STI) process. The STI process is performed by forming a device isolation trench in the substrate 110 and filling the device isolation trench with an isolation material.

Subsequently, a photoelectric conversion region 111 is formed in the substrate 110. The photoelectric conversion region 111 may include a plurality of photoelectric conversion units (not illustrated), which are overlapped with each other. Each photoelectric conversion unit may include a photo diode having an N-type impurity region and a P-type impurity region. The photo diode may be formed by an ion implantation process.

Subsequently, an interlayer insulation layer 112 including a signal generating circuit is formed over the front side of the substrate 110. The interlayer insulation layer 112 may include one or more materials selected from the group including an oxide, a nitride and an oxynitride. The interlayer insulation layer 112 may include a multilayer structure. The signal generating circuit generates and outputs the pixel signals (or electrical signals) corresponding to the photocharges generated in the photoelectric conversion region 111. The signal generating circuit may include a plurality of transistors (not illustrated), multilayer metal lines (not illustrated). The multilayer metal lines may be electrically coupled to the transistors and the other metal lines through a plurality of contact plugs (not illustrated).

As shown in FIG. 2B, a thinning process to the back side of the substrate 110 is performed to decrease the thickness of the substrate 110. Since arrival distance of the incident light reaching the photoelectric conversion region 110 is decreased, the photo detecting efficiency may be improved. The thinning process may include a backgrinding process and a polishing process.

Subsequently, a carbon-containing layer 113 having electric charges is formed over the back side of the substrate 110. The carbon-containing layer 113 having the electric charges may prevent generation of the dark current by controlling electric charges that generates the dark current. The carbon-containing layer 113 may be formed in contact with the back side of the substrate 110, and the carbon-containing layer 113 may be formed in an area overlapped with the photoelectric conversion region 111.

The carbon-containing layer 113 may include a graphene layer or a graphene-oxide layer. Light transmittances of the graphene layer and the graphene-oxide layer are known to about 98% or more. Thus, the carbon-containing layer 113 including the graphene layer or the graphene-oxide layer may improve sensitivity of the image sensor by minimizing light loss. The carbon-containing layer 113 may be formed with a thickness of 0.35 nm to 1 nm.

The carbon-containing layer 113 having the electric charges may include the graphene layer having the electric charges or the graphene-oxide layer having the electric charges. That is, the carbon-containing layer 113 may include the graphene layer doped with impurities or the graphene-oxide layer doped with impurities order to get a positive electric charge or a negative electric charge. The carbon-containing layer having the positive electric charge may prevent the generation of the dark current by pulling electron and controlling the flow of the electron. The carbon-containing layer having the negative electric charge may prevent the generation of the dark current by forming hole accumulation region and limiting behavior of the electron though the hole accumulation region.

Forming method of the graphene layer having the electric charges may include one method selected from the group including an in-situ doping method, an ion implantation method and a chemical reaction method. The ion implantation method is performed by implanting dopants into the graphene layer using an ion implantation equipment. The dopants may include boron (B) or nitrogen (N).

The graphene layer having the electric charges may be formed by doping the dopants in-situ during the graphene layer forming process. The dopants may include boron (B) or nitrogen (N). Also, the chemical reaction method is performed by reacting the graphene layer with a sulfanilic add ($C_6H_4(NH_2)SO_3H$) solution.

Forming method of the graphene layer having the electric charges over the back side of the substrate 110 may include a spin deposition method. Particularly, the spin deposition method includes dissolving the graphene layer having the electric charges in a solvent, coating the solvent with the graphene layer to the back side of the substrate 110, and dehydrating the substrate 110 to remain the graphene layer having the electric charges over the back side of the substrate 110.

The carbon-containing layer 113 having the electric charges may prevent the generation of the dark current. Also, the light loss may be minimized due to the high light transmittance of the graphene layer.

As shown in FIG. 2C, a color filter 114 and a micro-lens 115 are formed over the carbon-containing layer 113.

In the color filter 114, a plurality of filters are formed corresponding to the photoelectric conversion region 111. For example, a red filter, a green filter, and a blue filter may be formed corresponding to the photoelectric conversion region 111 of a red (R) pixel, a green (G) pixel and a blue (B) pixel. Also, when the image sensor includes an infrared photoelectric conversion region, an infrared filter corresponding to an infrared photo detector may be formed.

The micro-lens 115 may include a plurality of micro-lenses to focus the incident light to the photoelectric conversion region 111 in a corresponding pixel. The incident light through the micro-lens 115 is filtered and selected by corresponding color filters (the red filter, the green filter and the blue filter) or the infrared filter, and the selected light enters to the photoelectric conversion region 111 in the corresponding pixel.

Thereafter, the image sensor may be completed by a known fabrication method.

Figure 3:
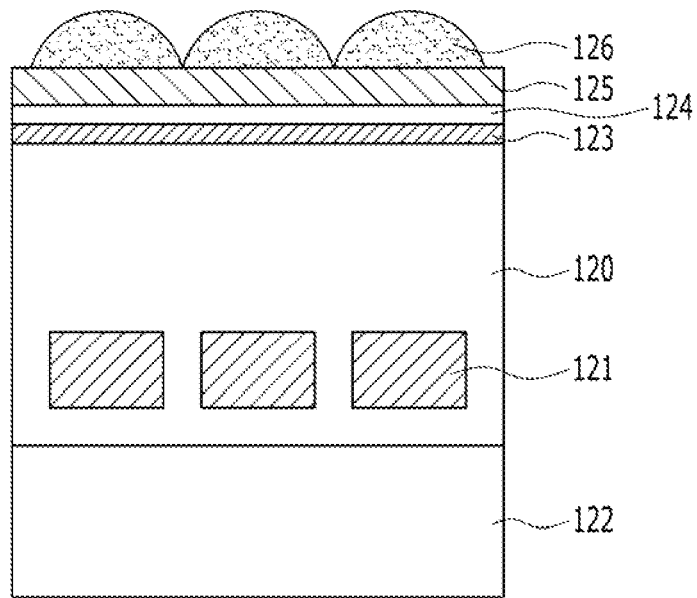
FIG. 3 is a cross-sectional view illustrating an image sensor in accordance with an embodiment of the present invention.

FIG. 3 is a cross-sectional view illustrating an image sensor in accordance with an embodiment of the present invention As shown in FIG. 3, the image sensor includes a photoelectric conversion region 121 formed in a substrate 120 having a plurality of pixels, a device isolation structure (not illustrated) isolating the pixels, an interlayer insulation layer 122 including a signal generating circuit (not illustrated) formed over a front side of the substrate 120, an anti reflective layer 123 formed over a back side of the substrate 120, a carbon-containing layer 124 having the electric charges formed over the anti reflective layer 123, a color filter 125 formed over the back side of the substrate 120, and a micro-lens 126 formed over the color filter 125.

The anti reflective layer 123 prevents reflection of the incident light to transmit the light into the photoelectric conversion region 121, and photo detecting efficiency of the image sensor may be improved. Also, since the anti reflective layer 123 is disposed between the back side of the substrate 120 and the carbon-containing layer 124 having the electric charges, the reliability of the image sensor may be improved by controlling defects occurring during the fabrication of the carbon-containing layer 124.

A first buffer layer (not illustrated) may be formed between the back side of the substrate 120 and the anti reflective layer 123, Also, a second buffer layer (not illustrated) may be formed between the anti reflective layer 123 and the carbon-containing layer 124. The second buffer layer as well as the anti reflective layer 123 may increase the reliability by controlling defects occurring during the fabrication of the carbon-containing layer 124.

The substrate 120, the photoelectric conversion region 121, the interlayer insulation layer 122, the carbon-containing layer 124, the color filter 125 and the micro-lens 126 are formed in a manner similar to the embodiment of the present invention shown in FIG. 1 and FIGS. 2A to 2C.

Meanwhile, the present invention illustrates a back side illumination image sensor and a method for fabricating the same, but the carbon-containing layer having the electric charges and the anti reflective layer are not limited to the embodiments set forth herein. The carbon-containing layer having the electric charges may be formed on the front side or back side of the substrate in the front side illumination image sensor, to prevent the generation of the dark current.

According to one embodiment of the present invention, since the carbon-containing layer having the electric charges is applied to the image sensor, generation of the dark current and the noise may be prevented by controlling electric charges that generates the dark current and the noise. Thus, the properties deterioration of the image sensor may be decreased by preventing the generation of the dark current and noise.

While the present invention has been described with respect to the specific embodiments, it will be apparent to those skilled in the art that various changes and modifications may be made without departing from the spirit and scope of the invention as defined in the following claims.

What is claimed is:

1. An image sensor, comprising:
   a photoelectric conversion region formed in a substrate;
   an interlayer insulation layer formed over a front side of the substrate;
   a carbon-containing layer doped with impurities and formed over a back side of the substrate; and
   a color filter and a micro-lens formed over the carbon-containing layer.

2. The image sensor of claim 1, wherein the carbon-containing layer includes a graphene layer or a graphene-oxide layer, which are doped with the impurities, to have electric charges.

3. The image sensor of claim 2, wherein the impurities include boron (B) or nitrogen (N).

4. The image sensor of claim 1, further including
   an anti reflective layer formed between the back side of the substrate and the carbon-containing layer.

5. The image sensor of claim 1, wherein the carbon-containing layer is formed in an area overlapped with the photoelectric conversion region.

6. A method for fabricating an image sensor, comprising:
   forming a photoelectric conversion region in a substrate;
   forming an interlayer insulation layer over a front side of the substrate;
   forming a carbon-containing layer having electric charges over a back side of the substrate;
   forming a color filter over the carbon-containing layer; and
   forming a micro-lens over the color filter.

7. The method of claim 6, wherein the forming of the carbon-containing layer having electric charges over the back side of the substrate comprises:
   forming a doped graphene layer or a doped graphene-oxide layer.

8. The method claim 6, further comprising:
   forming an anti reflective layer over the back side of the substrate before the forming of the carbon-containing layer.

9. The method of claim 7, wherein the doped graphene layer or the doped graphene-oxide layer is formed by one method selected from the group including an in-situ doping method, an ion implantation method and a chemical reaction method.

10. The method of claim 7, wherein the forming of the doped graphene or graphene-oxide layer includes:
   implanting dopants into a graphene layer or a graphene-oxide layer through an ion implantation equipment.

11. The method of claim 10, wherein the dopants include boron (B) or nitrogen (N).

12. The method of claim 7, wherein the fo a ming of the doped graphene or graphene-oxide layer includes:
   reacting a graphene layer or a graphene-oxide layer with a sulfanilic acid ($C_6H_4(NH_2)SO_3H$) solution.

13. The method of claim 7, wherein the forming of the doped graphene or graphene-oxide layer includes:
   doping dopants in-situ in a process of forming a graphene layer or a graphene-oxide layer.

14. The method of claim 7, wherein the forming of the carbon-containing layer having electric charges over the back side of the substrate further comprises:
   dissolving the doped graphene layer or the doped graphene-oxide layer in a solvent;
   coating the solvent to the back side of the substrate; and
   dehydrating the substrate to form the doped graphene layer or the doped graphene-oxide layer over the back side of the substrate.

* * * * *